US012685165B2

(12) United States Patent
Li et al.

(10) Patent No.: US 12,685,165 B2
(45) Date of Patent: *Jul. 14, 2026

(54) CHIP COOLING PLATFORM BASED ON MICRO-NANO STRUCTURE

(71) Applicant: GUANGDONG OCEAN UNIVERSITY, Zhanjiang (CN)

(72) Inventors: Haowei Li, Zhanjiang (CN); Weijun Feng, Zhanjiang (CN); Zehao Lu, Zhanjiang (CN); Zeming Chen, Zhanjiang (CN); Runji Xie, Zhanjiang (CN); Wenguan Li, Zhanjiang (CN)

(73) Assignee: GUANGDONG OCEAN UNIVERSITY, Zhanjiang (CN)

( * ) Notice: Subject to any disclaimer, the term of this patent is extended or adjusted under 35 U.S.C. 154(b) by 13 days.

This patent is subject to a terminal disclaimer.

(21) Appl. No.: 18/879,082

(22) PCT Filed: Sep. 13, 2024

(86) PCT No.: PCT/CN2024/118663
§ 371 (c)(1),
(2) Date: Dec. 26, 2024

(87) PCT Pub. No.: WO2025/148377
PCT Pub. Date: Jul. 17, 2025

(65) Prior Publication Data
US 2025/0226287 A1 Jul. 10, 2025

(30) Foreign Application Priority Data

Jan. 10, 2024 (CN) .......................... 202410033073.4

(51) Int. Cl.
*H05K 7/20* (2006.01)
*H10W 40/47* (2026.01)
*H10W 40/77* (2026.01)

(52) U.S. Cl.
CPC ........ *H05K 7/20272* (2013.01); *H10W 40/47* (2026.01); *H10W 40/77* (2026.01)

(58) Field of Classification Search
CPC ........... H05K 7/20254; H05K 7/20263; H05K 7/20272; H05K 7/20281; H10W 40/47; H10W 40/73; H10W 40/77
See application file for complete search history.

(56) References Cited

U.S. PATENT DOCUMENTS 9,803,938 B2 * 10/2017 Joshi ...................... F28F 13/185
12,278,164 B1 * 4/2025 Li ........................ H10W 40/258
(Continued)

FOREIGN PATENT DOCUMENTS

CN 113013120 A 6/2021
CN 113556914 A 10/2021
(Continued)

OTHER PUBLICATIONS

CNIPA, Office Action, Application No. 202410033073.4, Feb. 19, 2024.
(Continued)

*Primary Examiner* — Eric S Ruppert
*Assistant Examiner* — Hans R Weiland
(74) *Attorney, Agent, or Firm* — WCF IP

(57) ABSTRACT

A chip cooling platform based on a micro-nano structure includes, a platform body, a cooling pipeline, and an outer heat dissipation device. The cooling pipeline is of a closed-loop structure, and part of cooling pipeline is arranged in the platform body. The cooling pipeline is filled with a cooling medium, and a turbulence structure is arranged on an inner wall of the cooling pipeline in the platform body. A first one-way hydraulic pump is mounted on the cooling pipeline (Continued)

outside the platform body. The outer heat dissipation device is configured to dissipate heat from the cooling medium in the cooling pipeline.

3 Claims, 3 Drawing Sheets

(56) References Cited

U.S. PATENT DOCUMENTS

| | | | |
|---|---|---|---|
| 2005/0211427 A1* | 9/2005 | Kenny | F28F 3/048 |
| | | | 165/299 |
| 2017/0092565 A1* | 3/2017 | Chen | H10W 40/475 |
| 2022/0205699 A1 | 6/2022 | Huang et al. | |
| 2022/0375817 A1* | 11/2022 | Berntson | H10W 40/257 |
| 2023/0207426 A1* | 6/2023 | Yaglioglu | F28F 9/0278 |
| | | | 257/714 |

FOREIGN PATENT DOCUMENTS

| | | |
|---|---|---|
| CN | 116581094 A | 8/2023 |
| CN | 117542811 A | 2/2024 |

OTHER PUBLICATIONS

Sun et al: "Numerical Simulation of the Intensified Heat Exchange of a Nano-fluid inside a Foam Metal Tube", Journal of Engineering for Thermal Energy & Power, vol. 31, No. 9, p. 9-14, 2016.

* cited by examiner

CHIP COOLING PLATFORM BASED ON MICRO-NANO STRUCTURE

CROSS-REFERENCE TO RELATED APPLICATION

This patent application is a national stage application of International Patent Application No. PCT/CN2024/118663, filed on Sep. 13, 2024, which claims priority of Chinese Patent Application No. 202410033073.4, filed on Jan. 10, 2024, both of which are incorporated by references in their entities.

TECHNICAL FIELD

The present disclosure relates to the technical field of heat dissipation of chips, and in particular to a novel chip cooling platform based on a micro-nano structure.

BACKGROUND

In the aspect of liquid cooling, the existing chip heat dissipation device mainly uses cooling media to flow in the pipeline and exchanges heat with the chip through the cold plate. However, both the flat tube type heat dissipation device and the circular tube heat dissipation device have the problems of large contact angle between the cooling medium and the heat exchange material of the chip and poor wetting performance, which affects the heat exchange performance to some extent. In addition, with the rapid development of science and technology, the integration of integrated circuits is increasing, the volume of electronic products is gradually decreasing, and the requirements for heat dissipation devices are constantly improving. At present, the heat dissipation devices on the market are limited by the processing technology, and have some problems such as large volume, low material utilization rate, low effective heat dissipation area, and low heat dissipation efficiency. Therefore, the heat dissipation device needs to meet the requirements of small size, high material utilization rate, large effective heat dissipation area and high heat dissipation efficiency while meeting the requirements of efficient heat dissipation. Therefore, developing a novel, efficient and small-volume heat dissipation device has become an urgent problem to be solved at present.

SUMMARY

A purpose of the present disclosure is to provide a novel chip cooling platform based on a micro-nano structure, so as to solve the problems in the prior art.

In order to achieve the purpose above, a novel chip cooling platform based on a micro-nano structure provided by the present disclosure includes:

a platform body;

a cooling pipeline, where the cooling pipeline is of a closed-loop structure, part of the cooling pipeline is arranged in the platform body, the cooling pipeline is filled with a cooling medium, a turbulence structure is arranged on an inner wall of the cooling pipeline in the platform body, and a first one-way hydraulic pump is mounted on the cooling pipeline outside the platform body; and an outer heat dissipation device configured to dissipate heat from the cooling medium in the cooling pipeline.

Preferably, the turbulence structure includes several micro-nano protrusions arranged on the inner wall of the cooling pipeline, the micro-nano protrusions are equidistantly arranged in a circumferential direction of the cooling pipeline, and the micro-nano protrusions are arranged in a staggered manner in an axial direction of the cooling pipeline.

Preferably, the micro-nano protrusions are made of metal foam.

Preferably, two adjacent micro-nano protrusions of the micro-nano protrusions have opposite arrangement angle directions.

Preferably, the cooling medium is liquid metal.

Preferably, the cooling pipeline in the platform body is of a serpentine structure.

Preferably, the novel chip cooling platform further includes:

a connecting pipeline arranged outside the platform body, where both ends of the connecting pipeline are mounted on the cooling pipeline through three-way valves, a second one-way hydraulic pump is mounted on the connecting pipeline, and the second one-way hydraulic pump and the first one-way hydraulic pump are arranged in parallel;

a temperature measuring assembly arranged on the cooling pipeline at an outlet end of the platform body, where the temperature measuring assembly is configured to measure a temperature of the cooling medium in the cooling pipeline; and a control motor configured to control on/off and a flow direction of each of the three-way valves, where the temperature measuring assembly is electrically connected to the control motor.

Preferably, the temperature measuring assembly is a thermometer.

Preferably, the outer heat dissipation device includes a heat dissipation pipeline, both ends of the heat dissipation pipeline are in communication with the cooling pipeline, and an evaporator, a compressor, a condenser and an expansion valve are arranged on the heat dissipation pipeline in a flow direction of the cooling medium in sequence, and the heat dissipation pipeline at an outlet end of the expansion valve is in communication with the cooling pipeline through the evaporator.

Preferably, the platform body includes:

wall boards; and heat-conducting assemblies fixedly mounted on inner walls of the wall boards, where each of the heat-conducting assemblies includes a heat dissipation thin plate, a T4 red copper plate, and heat-conducting silicon grease; the cooling pipeline is arranged between two of the heat-conducting assemblies, and the cooling pipeline is in contact fit with the heat dissipation thin plate.

Compared with the prior art, the present disclosure achieves the following beneficial effects:

1. Compared with the traditional liquid cooling heat dissipation technology with working medium water as a coolant, the present disclosure has the advantages of high heat conductivity and low viscosity, capability of reducing heat resistance and heat stress, good heat exchange effect, fast heat exchange and short heat exchange time by virtue of the characteristics of liquid metal itself.

2. Compared with the traditional normal pipelines with liquid heat dissipation, a laminar zone of a fluid is destroyed by applying the proper number of micro-nano protrusions with metal foam materials arranged in the cooling pipeline, such that the cooling medium in the cooling pipeline is kept in a turbulent state to enhance heat exchange. Meanwhile, due to the own characteristics of low density and high porosity of the metal foam and the micro-nano structure, a contact angle of the cooling fluid is reduced, and the wettability and permeability are enhanced while ensuring light weight.

3. The liquid metal is used as the coolant, which can reduce the occupied space of the heat dissipation device and achieve the miniaturization of the electronic device in a case of ensuring the effective heat dissipation area unchanged. The close arrangement of adjacent serpentine channels can improve the utilization rate of space, make the pipeline in contact with the chip on four sides, and strengthen the heat exchange performance.

4. By controlling the on/off of the three-way valve and the one-way hydraulic pump, the liquid metal can continue to circulate in the cooling pipeline in the cooling platform to cool the chip when still at a low temperature. After the liquid metal reaches the temperature to be cooled, the flow direction of the three-way valve is controlled to make the liquid metal flow out of the cooling pipeline and flow into the outer heat dissipation device for heat dissipation and cooling, thus achieving the effects of efficient cooling, energy saving and emission reduction.

BRIEF DESCRIPTION OF THE DRAWINGS

To describe the technical solutions of the embodiments of the present disclosure or in the prior art more clearly, the following briefly introduces the accompanying drawings required for describing the embodiments. Apparently, the accompanying drawings in the following description show merely some embodiments of the present disclosure, and those of ordinary skill in the art may still derive other drawings from these accompanying drawings without creative efforts.

Figure 1:
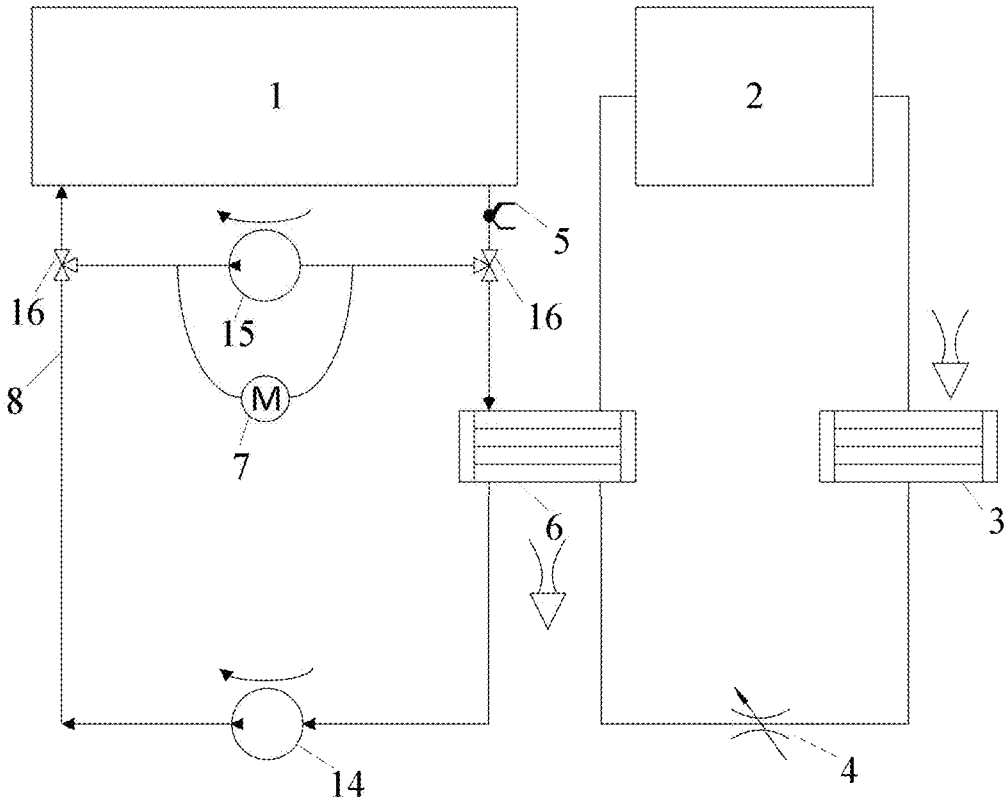
FIG. 1 is a cooling flow chart of a chip cooling platform according to the present disclosure.
Figure 2:
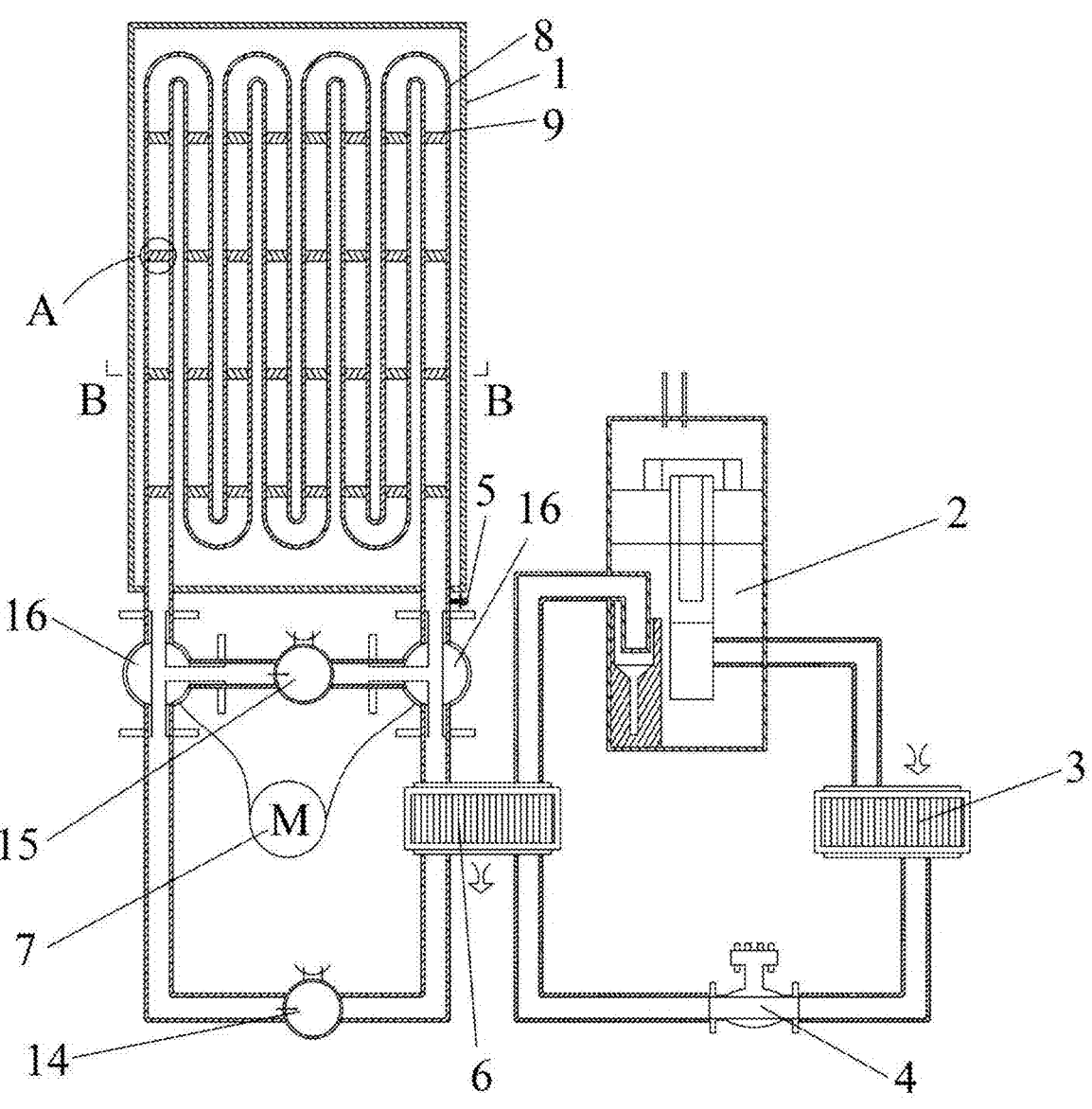
FIG. 2 is a planar diagram of a chip cooling platform according to the present disclosure.
Figure 3:
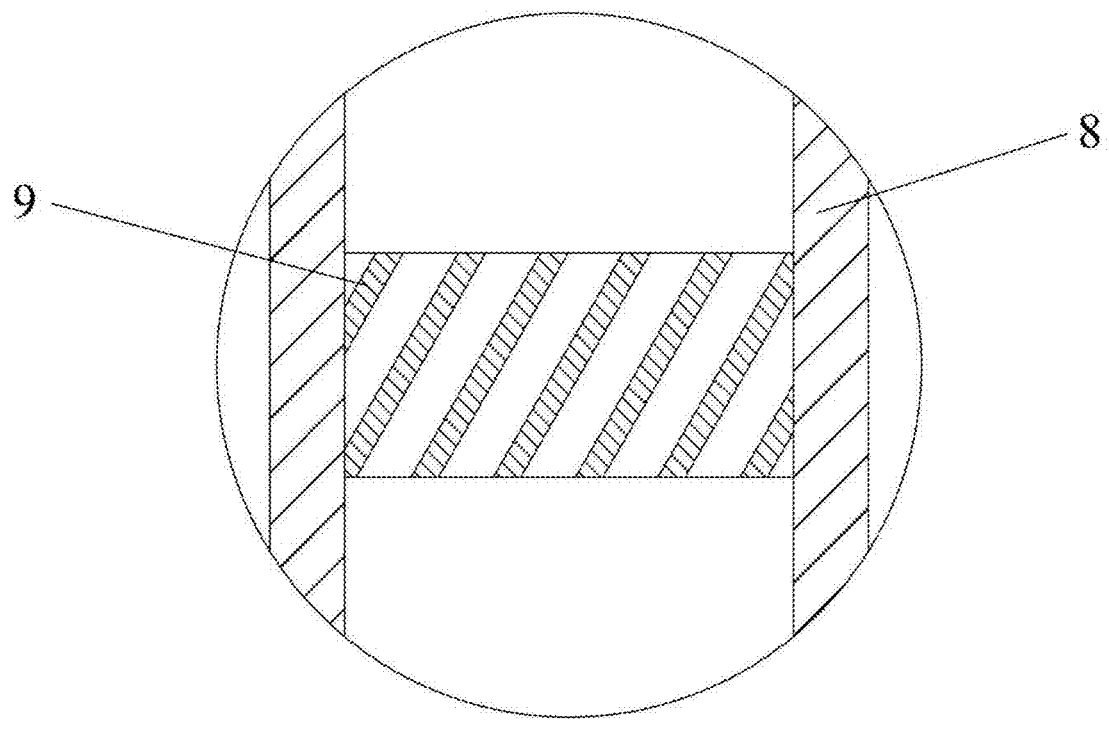
FIG. 3 is a partial enlarged view of position A in FIG. 2.
Figure 4:
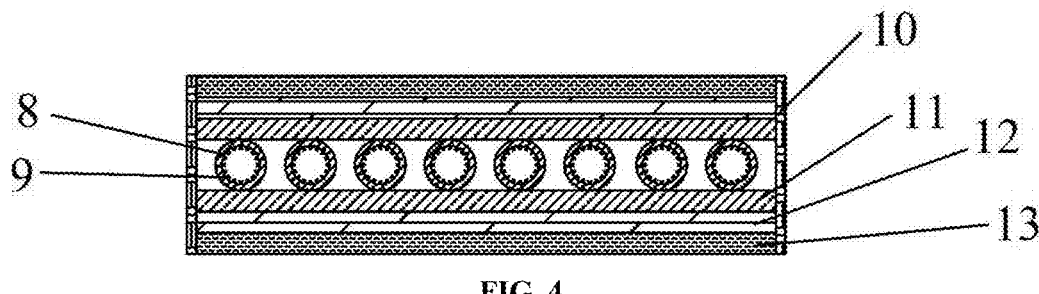
FIG. 4 is a sectional diagram in direction B-B in FIG. 2.

In the drawings: 1 platform body; 2 compressor; 3 condenser; 4 expansion valve; 5 thermometer; 6 evaporator; 7 control motor; 8 cooling pipeline; 9 micro-nano protrusion; 10 wall board; 11 heat dissipation thin plate; 12 T4 red copper plate; 13 heat-conducting silicone grease; 14 first one-way hydraulic pump; 15 second one-way hydraulic pump; 16 three-way valve.

DETAILED DESCRIPTION OF THE EMBODIMENTS

It should be noted that the embodiments in the present disclosure and the features in the embodiments can be combined with each other without conflict. The described embodiments are merely a part rather than all of the embodiments of the present disclosure. All other embodiments obtained by those of ordinary skill in the art based on the embodiments of the present disclosure without creative efforts shall fall within the scope of protection of the present disclosure. The present disclosure is described in detail below with reference to the accompanying drawings and embodiments.

A novel chip cooling platform based on a micro-nano structure provided by the present disclosure includes:

a platform body 1;

a cooling pipeline 8, where the cooling pipeline 8 is of a closed-loop structure, part of the cooling pipeline 8 is arranged in the platform body 1, the cooling pipeline 8 is filled with a cooling medium, a turbulence structure is arranged on an inner wall of the cooling pipeline 8 in the platform body 1, and a first one-way hydraulic pump 14 is mounted on the cooling pipeline 8 outside the platform body 1; and an outer heat dissipation device configured to dissipate heat from the cooling medium in the cooling pipeline 8.

A laminar state of the cooling medium is destroyed through the arrangement of the turbulence structure, and meanwhile, the turbulence structure can enhance the disturbance of the cooling medium and enhance a convection between the cooling media, such that the cooling media in the cooling pipeline 8 can be kept in a turbulent condition, a contact angle of the cooling medium is reduced, and the purpose of enhancing heat exchange can be achieved.

Further, the turbulence structure includes several micro-nano protrusions 9 arranged on the inner wall of the cooling pipeline 8. The micro-nano protrusions 9 are equidistantly arranged in a circumferential direction of the cooling pipeline 8, and the micro-nano protrusions 9 are arranged in a staggered manner in an axial direction of the cooling pipeline 8. The micro-nano protrusions 9 are made of metal foam, and the two adjacent micro-nano protrusions 9 have opposite arrangement angle directions.

The micro-nano protrusions 9 are formed by connecting many tiny metal particles to form a complex three-dimensional network structure, which can effectively increase the surface area of a pipe wall and turbulence degree, thus improving a heat transfer coefficient. The characteristics of loose and porous of the metal foam are utilized to destroy a laminar bottom layer of the cooling fluid on the pipe wall by changing the shape and arrangement of the micro-nano protrusions 9. The micro-nano protrusions 9 have good heat conductivity and mechanical strength, which can be closely engaged with the pipe wall to ensure the stability and reliability of cooling medium. And the burden and cost of the chip cooling heat dissipation system are reduced by utilizing the characteristics of low density and low weight of the micro-nano protrusions 9.

Further, the cooling medium is liquid metal.

The liquid metal is used as a coolant, and has the characteristics of high heat conductivity, low viscosity, and low heat resistance.

Further, the cooling pipeline 8 in the platform body 1 is of a serpentine structure.

Further, the present disclosure further includes:

a connecting pipeline arranged outside the platform body 1, where both ends of the connecting pipeline are mounted on the cooling pipeline 8 through three-way valves 16, a second one-way hydraulic pump 15 is mounted on the connecting pipeline, and the second one-way hydraulic pump 15 and the first one-way hydraulic pump 14 are arranged in parallel;

a temperature measuring assembly arranged on the cooling pipeline 8 at an outlet end of the platform body 1, the temperature measuring assembly is configured to measure a temperature of the cooling medium in the cooling pipeline 8; and a control motor 7 configured to control on/off and a flow direction of each of the three-way valves 16, where the temperature measuring assembly is electrically connected to the control motor 7.

Further, the temperature measuring assembly is a thermometer 5.

Further, the outer heat dissipation device includes a heat dissipation pipeline. Both ends of the heat dissipation pipeline are in communication with the cooling pipeline 8, and an evaporator 6, a compressor 2, a condenser 3 and an expansion valve 4 are arranged on the heat dissipation pipeline in a flow direction of the cooling medium in sequence. The heat dissipation pipeline at an outlet end of the expansion valve 4 is in communication with the cooling pipeline 8 through the evaporator 6.

Further, the platform body 1 includes:

wall boards 10; and heat-conducting assemblies fixedly mounted on inner walls of the wall boards 10, where each of the heat-conducting assemblies includes a heat dissipation thin plate 11, a T4 red copper plate 12, and heat-conducting silicon grease 13; the cooling pipeline 8 is arranged between two of the heat-conducting assemblies, and the cooling pipeline 8 is in contact fit with the heat dissipation thin plate 11.

The working principle of the novel chip cooling platform based on a micro-nano protrusion is as follows: the liquid metal flows into the platform body 1 through the cooling pipeline 8 to start work, the flow direction of the three-way valve 16 is controlled and the second one-way hydraulic pump 15 is started, such that the liquid metal with excellent cooling performance can reciprocate and circulate in the cooling pipeline 8 and the heat dissipation pipeline for cooling. During circular cooling, the laminar state of the liquid metal is destroyed by the micro-nano protrusions 9 arranged in the cooling pipeline 8, and meanwhile, the arrangement of the micro-nano protrusions 9 enhances the disturbance of the liquid metal, enhances the convection between liquid metals, keeps the liquid metal in a turbulent condition in the cooling pipeline 8, and reduces a contact angle of the cooling fluid, thus achieving the purpose of enhancing heat exchange.

The temperature of the liquid metal flowing out of the cooling platform after one cycle is measured by the thermometer 5, and meanwhile, a temperature measurement result is fed back to the control motor 7. When the temperature detected by a program in the control motor 7 reaches a threshold set by the program, the flow direction of the three-way valve 16 is controlled, and the outer heat dissipation device is used to dissipate heat from the liquid with higher temperature after circulation. When the heat dissipation of the liquid metal is finished, the first one-way hydraulic pump 14 is started to re-introduced the liquid metal with the cooling effect into the cooling pipeline 8, and then the liquid metal circulates again in the cooling platform for cooling the chip.

When the thermometer 5 detects that the liquid metal flowing out does not reach the set threshold temperature, the liquid metal with good cooling performance is refluxed into the connecting pipeline by controlling the flow direction of the three-way valve 16, and the second one-way hydraulic pump 15 is started to re-introduce the liquid metal into the cooling pipeline 8 to continue working, so as to achieve the purposes of sufficient heat exchange and efficient cooling.

Compared with the traditional normal pipelines with liquid heat dissipation, by applying the proper number of micro-nano protrusions arranged in the cooling pipeline with metal foam materials, a laminar zone of a fluid is destroyed through an arrangement direction of the micro-nano protrusions 9, such that the liquid metal in the cooling pipeline 8 is kept in a turbulent state to enhance heat exchange. Meanwhile, due to the own characteristics of low density and high porosity of the metal foam and the micro-nano structure, a contact angle of the cooling fluid is reduced, and the wettability and permeability are enhanced while ensuring light weight. By determining the temperature of the liquid metal, the utilization efficiency of the liquid metal is significantly improved, and the purpose of energy saving and emission reduction is achieved.

The above is only the preferred specific embodiment of the present disclosure, but the scope of protection of the present disclosure is not limited thereto. Any change or substitution that can be easily thought of by any person skilled in the art within the technical scope disclosed in the present disclosure should be covered by the scope of protection of the present disclosure. Therefore, the scope of protection of the present disclosure shall be subject to the scope of the appended claims.

What is claimed is:

1. A novel chip cooling platform based on a micro-nano structure, comprising:

a platform body (1);

a cooling pipeline (8), wherein the cooling pipeline (8) is of a closed-loop structure, part of the cooling pipeline (8) is arranged in the platform body (1), the cooling pipeline (8) is filled with a cooling medium which is liquid metal, a turbulence structure is arranged on an inner wall of the cooling pipeline (8) in the platform body (1), and a first one-way hydraulic pump (14) is mounted on the cooling pipeline (8) outside the platform body (1); and an outer heat dissipation device configured to dissipate heat from the cooling medium in the cooling pipeline (8);

the turbulence structure comprises several micro-nano protrusions (9) arranged on the inner wall of the cooling pipeline (8), the micro-nano protrusions (9) are equidistantly arranged in a circumferential direction of the cooling pipeline (8), and the micro-nano protrusions (9) are arranged in a staggered manner in an axial direction of the cooling pipeline (8);

two adjacent micro-nano protrusions (9) of the micro-nano protrusions (9) have opposite arrangement angle directions;

the novel chip cooling platform further comprises:

a connecting pipeline arranged outside the platform body (1), wherein both ends of the connecting pipeline are mounted on the cooling pipeline (8) through three-way valves (16), a second one-way hydraulic pump (15) is mounted on the connecting pipeline, and the second one-way hydraulic pump (15) and the first one-way hydraulic pump (14) are arranged in parallel;

a temperature measuring assembly arranged on the cooling pipeline (8) at an outlet end of the platform body (1), wherein the temperature measuring assembly is configured to measure a temperature of the cooling medium in the cooling pipeline (8); and a control motor (7) configured to control on/off and a flow direction of each of the three-way valves (16), wherein the temperature measuring assembly is electrically connected to the control motor (7);

the micro-nano protrusions (9) are made of metal foam;

the cooling pipeline (8) in the platform body (1) is of a serpentine structure;

the outer heat dissipation device comprises a heat dissipation pipeline, both ends of the heat dissipation pipeline are in communication with the cooling pipeline (8), and an evaporator (6), a compressor (2), a condenser (3) and an expansion valve (4) are arranged on the heat dissipation pipeline in a flow direction of the cooling medium in sequence, and the heat dissipation pipeline at an outlet end of the expansion valve (4) is in communication with the cooling pipeline (8) through the evaporator (6).

2. The novel chip cooling platform based on the micro-nano structure according to claim 1, wherein the temperature measuring assembly is a thermometer (5).

3. The novel chip cooling platform based on the micro-nano structure according to claim 1, wherein the platform body (1) comprises:

wall boards (10); and heat-conducting assemblies fixedly mounted on inner walls of the wall boards (10), wherein each of the heat-conducting assemblies comprises a heat dissipation thin plate (11), a T4 red copper plate (12), and heat-conducting silicon grease (13); the cooling pipeline (8) is arranged between two of the heat-conducting assemblies, and the cooling pipeline (8) is in contact fit with the heat dissipation thin plate (11).

\* \* \* \* \*